(12) United States Patent
Seddon

(10) Patent No.: US 10,679,898 B2
(45) Date of Patent: Jun. 9, 2020

(54) SEMICONDUCTOR SUBSTRATE DIE SAWING SINGULATION SYSTEMS AND METHODS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/674,780

(22) Filed: Nov. 5, 2019

(65) Prior Publication Data

US 2020/0066592 A1    Feb. 27, 2020

Related U.S. Application Data

(63) Continuation-in-part of application No. 15/964,496, filed on Apr. 27, 2018, now abandoned.

(51) Int. Cl.
H01L 21/78 (2006.01)
H01L 21/04 (2006.01)

(52) U.S. Cl.
CPC .......... H01L 21/78 (2013.01); H01L 21/0445 (2013.01)

(58) Field of Classification Search
CPC ... H01L 21/784; H01L 21/78; H01L 21/0445; H01L 21/8213; B23D 51/00
See application file for complete search history.

(56) References Cited

U.S. PATENT DOCUMENTS

| | | | |
|---|---|---|---|
| 2005/0217560 A1* | 10/2005 | Tolchinsky | C30B 15/36 117/11 |
| 2007/0134833 A1* | 6/2007 | Ikemoto | H01L 33/0095 438/33 |
| 2008/0008641 A1* | 1/2008 | Leonard | C30B 23/00 423/345 |
| 2009/0283760 A1* | 11/2009 | Fujii | H01L 29/045 257/43 |
| 2014/0264374 A1* | 9/2014 | Hecht | H01L 21/02529 257/77 |

* cited by examiner

*Primary Examiner* — Victor A Mandala
(74) *Attorney, Agent, or Firm* — Adam R. Stephenson, LTD.

(57) ABSTRACT

Implementations of methods of cutting a semiconductor substrate may include aligning a first saw blade substantially perpendicularly with a crystal plane of a non-cubic crystalline lattice of a semiconductor substrate coupled with a backmetal layer and cutting through at least a majority of the semiconductor substrate at an angle substantially perpendicular with the crystal plane of the non-cubic crystalline lattice of the semiconductor substrate. The method may also include aligning a second saw blade substantially perpendicularly with the semiconductor substrate and cutting entirely through the semiconductor substrate and the backmetal layer using the second saw blade.

20 Claims, 2 Drawing Sheets

SEMICONDUCTOR SUBSTRATE DIE SAWING SINGULATION SYSTEMS AND METHODS

CROSS REFERENCE TO RELATED APPLICATIONS

This application is a continuation-in-part application of the earlier U.S. Utility Patent Application to Michael J. Seddon entitled "Semiconductor Substrate Die Sawing Singulation Systems and Methods," application Ser. No. 15/964,496, filed Apr. 27, 2018, now pending, the disclosure of which is hereby incorporated entirely herein by reference.

BACKGROUND

1. Technical Field

Aspects of this document relate generally to singulating semiconductor substrates. More specific implementations involve singulating silicon carbide semiconductor substrates.

2. Background

Semiconductor substrates are often formed and singulated in order to form semiconductor die. Semiconductor substrates are often sawn using a dicing sawing process to separate the die from the substrate.

SUMMARY

Implementations of methods of cutting a semiconductor substrate may include aligning a first saw blade substantially perpendicularly with a crystal plane of a non-cubic crystalline lattice of a semiconductor substrate coupled with a backmetal layer and cutting through at least a majority of the semiconductor substrate at an angle substantially perpendicular with the crystal plane of the non-cubic crystalline lattice of the semiconductor substrate. The method may also include aligning a second saw blade substantially perpendicularly with the semiconductor substrate and cutting entirely through the semiconductor substrate and the backmetal layer using the second saw blade.

Implementations of methods of cutting a semiconductor substrate may include one, all, or any of the following:

The non-cubic crystalline lattice may be hexagonal.

The crystal plane may be angled at four degrees from a largest planar surface of the semiconductor substrate.

The first saw blade may be aligned by tilting relative to the semiconductor substrate.

The first saw blade may be aligned by tilting the semiconductor substrate relative to the first saw blade.

Cutting through at least a majority of the semiconductor substrate may further include cutting through 95% of the semiconductor substrate.

Cutting through at least a majority of the semiconductor substrate may further include cutting through 99% of the semiconductor substrate.

Implementations of a method of cutting a silicon carbide semiconductor substrate may include aligning a first saw blade substantially perpendicularly with an off angle of the crystal lattice of a silicon carbide semiconductor substrate coupled with a backmetal layer and cutting through at least a majority of the silicon carbide semiconductor substrate with the saw blade at a substantially perpendicular angle. The method may also include aligning a second saw blade substantially perpendicularly with the silicon carbide semiconductor substrate and cutting entirely through the silicon carbide semiconductor substrate and the backmetal layer using the second saw blade.

Implementations of a method of cutting a silicon carbide semiconductor substrate may include one, all, or any of the following:

Cutting through at least a majority of the silicon carbide semiconductor substrate may further include cutting through 95% of the silicon carbide semiconductor substrate.

The crystal plane may be angled at four degrees relative to a largest planar surface of the silicon carbide semiconductor substrate.

The first saw blade may be aligned by tilting relative to the semiconductor substrate.

The first saw blade may be aligned by tilting the semiconductor substrate relative to the first saw blade.

Implementations of a method of singulating a silicon carbide semiconductor substrate may include aligning a first saw blade substantially parallel with a c-axis of a silicon carbide semiconductor substrate coupled with a backmetal layer and cutting through at least a majority of the silicon carbide semiconductor substrate at an angle substantially parallel with the c-axis of the silicon carbide semiconductor substrate. The method may also include aligning a second saw blade substantially perpendicularly with the silicon carbide semiconductor substrate and singulating the silicon carbide semiconductor substrate into a plurality of semiconductor die by cutting entirely through the silicon carbide semiconductor substrate and the backmetal layer using the second saw blade.

Implementations of a method of singulating a silicon carbide semiconductor substrate may include one, all, or any of the following:

The method may further include tilting the first saw blade relative to the silicon carbide semiconductor substrate from a first position to a second position and cutting the silicon carbide semiconductor substrate in a first direction.

The method may further include tiling the first saw blade back to the first position.

The method may further include tilting the silicon carbide semiconductor substrate relative to the first saw blade and cutting the silicon carbide substrate in a second position.

The first saw blade and the second saw blade may include diamond.

The crystal plane may be angled at four degrees relative to a largest planar surface of the silicon carbide semiconductor substrate.

A first sidewall and a second sidewall of each semiconductor die of the plurality of semiconductor die may be each angled relative to a largest planar surface of each semiconductor die.

A third sidewall and a fourth sidewall of each semiconductor die of the plurality of semiconductor die may be each substantially perpendicular to the largest planar surface of each semiconductor die.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor substrate singulation systems will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor substrate singulation systems, and implementing components and methods, consistent with the intended operation and methods.

A wide variety of semiconductor substrate types exist and are used in the process of manufacturing various semiconductor devices. Non-limiting examples of semiconductor substrates that may be processed using the principles disclosed in this document include single crystal silicon, silicon dioxide, glass, silicon-on-insulator, gallium arsenide, sapphire, ruby, silicon carbide, polycrystalline or amorphous forms of any of the foregoing, and any other substrate type useful for constructing semiconductor devices. Particular implementations disclosed herein may utilize silicon carbide (SiC) semiconductor substrates, including any polytype of SiC. There are over 250 different polytypes of SiC including the 3C—SiC, 4H—SiC, and 6H—SiC polytypes. Though this document specifically addresses hexagonal polytypes of SiC, it is understood that the methods and disclosed herein may be applied to any other polytypes of SiC. In this document the term "semiconductor substrate" is also used along with "substrate" as a semiconductor substrate is a common type of substrate, but not as an exclusive term that is used to refer to all semiconductor substrate types. The various semiconductor substrate types disclosed in this document may be, by non-limiting example, round, rounded, square, rectangular, or any other closed shape in various implementations.

In various implementations, semiconductor substrates, such as a single crystal SiC semiconductor substrate, do not have a cubic crystalline lattice, but rather have a non-cubic crystalline lattice, such as a hexagonal crystalline lattice.

Figure 1:
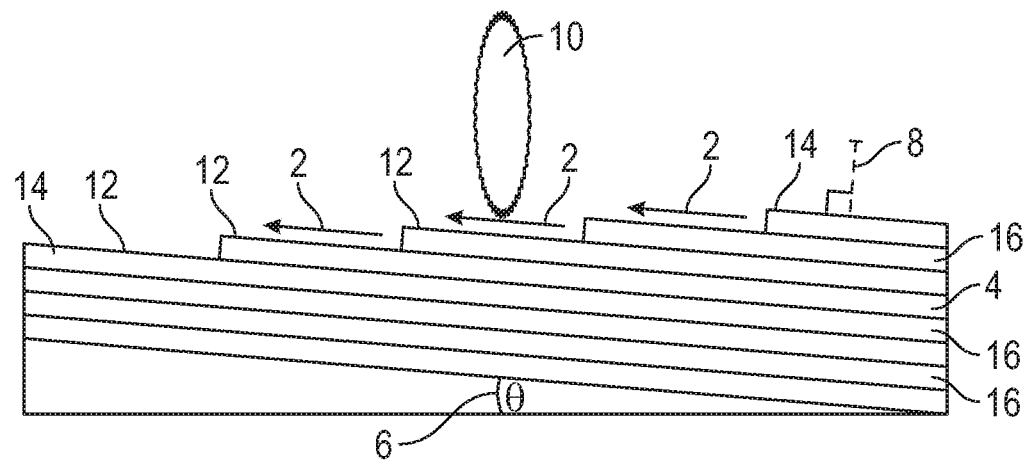
FIG. 1 is a cross sectional side view of a semiconductor substrate with a saw blade aligned perpendicularly with the largest planar surface of the semiconductor substrate.

While this application primarily refers to a system and method for sawing SiC semiconductor substrates, the principles disclosed herein may be applied to other semiconductor substrates having any non-cubic crystalline lattices, such as, by non-limiting example, GaN semiconductor substrates. Referring to FIG. 1, a cross sectional side view of a semiconductor substrate with a saw blade aligned perpendicular to the largest planar surface of the semiconductor substrate is illustrated. As illustrated, the direction 2 of the lateral step flow growth of the crystalline lattice is non-parallel to the largest planar surface of the semiconductor substrate 4. In particular implementations, because of the non-cubic crystalline lattice (which may be hexagonal in the case of SiC), the crystal plane, is formed in the same direction as the direction of the lateral step flow growth 2. Because of this, the crystal plane for certain semiconductor substrates, including SiC, is not parallel to the largest planar surface of the semiconductor substrate 4 but is slightly angled at substantially four degrees relative to the plane of the semiconductor substrate (the "off angle" 6). It is noted that the angle illustrated by FIG. 1 is not to scale. This angle can vary depending on how the particular boule is grown and the characteristics of the seed crystal used for growing the boule between about one degree to about six degrees in various implementations. In various implementations, the off angle may be about 4 degrees. In various implementations, this angle is determined at the time the boule is manufactured.

As used herein, the c-axis of the semiconductor substrate is that axis perpendicular or substantially perpendicular to the c-plane. By sawing the semiconductor substrate at an angle not perpendicular, substantially perpendicular to the crystal plane, or not parallel to the c-axis 8, of the semiconductor substrate, the risk of cracks, including microcracks, forming and propagating into the material of the semiconductor substrate during singulation may be increased. Along with cracks, it is more likely for chips and other defects to occur while cutting the semiconductor substrate because the forces being applied to the semiconductor substrate are not parallel to the c-axis (or not perpendicular to the crystal planes) being cut. Finally, the saw blade 10 may be more likely to wear faster if cut perpendicular to the largest planar surface of the semiconductor substrate and not perpendicular to the crystal plane.

As illustrated by FIG. 1, the effect of the crystal planes of the semiconductor substrate 4 is to create various striations 16 on the surface of the semiconductor substrate following separation that extend into the material of the semiconductor substrate at the off angle 6 (about four degrees in this case). In various implementations, the lateral step flow growth of the crystalline lattice may result in a plurality of terraces 12 forming the striations along the basal plane 14. The actual shape of the striations 16 on the semiconductor substrate in cross section is not as uniform or evenly spaced as illustrated in FIG. 1, as the shape in cross section in FIG. 1 is merely illustrative of the presence of the striations rather than of their shape. Also, the striations are formed randomly as the material of the semiconductor substrate 4 separates from the boule, so the regular pattern illustrated in FIG. 1 and other figures in this application is merely intended to show the positioning of the striations rather than their actual shape. In various implementations, however, the surface of the substrate may be polished to remove or substantially remove the striations prior to singulation.

Figure 2:
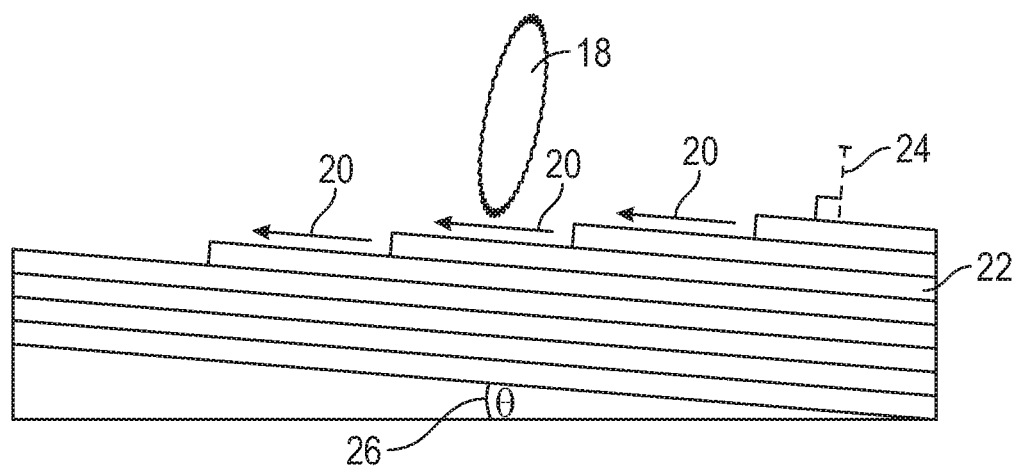
FIG. 2 is a cross sectional side view of a semiconductor substrate with a saw blade aligned perpendicularly with the crystal plane of the semiconductor substrate.

Referring to FIG. 2, a cross sectional side view of a semiconductor substrate with a saw blade aligned perpendicular or substantially perpendicularly with the crystal plane of the semiconductor substrate is illustrated. In various implementations, the method for sawing (or otherwise cutting) a semiconductor substrate 22 includes aligning a saw blade 18 substantially perpendicularly with a crystal plane (which may follow the direction 20 of lateral step flow growth of the crystalline lattice) of a crystalline lattice, which may be hexagonal. In other words, the method for cutting the semiconductor substrate 22 includes aligning the saw blade 18 parallel with or substantially parallel with the c-axis 24, or perpendicular with or substantially perpendicular with the off angle 26. In various implementations, the saw blade 18 may be a diamond studded saw blade, where the diamond particles are held in a binding matrix that forms the structure of the saw blade. In various implementations, the semiconductor substrate 22 may be tilted to align the c-axis 24 parallel with a plane aligned with the longest dimension of the saw blade 18 aligned at the center of the kerf of the saw blade. In other implementations, the saw blade 18 itself may be tilted to align the crystal plane perpendicularly, or the c-axis 24 parallel, to the plane of the saw blade. In various implementations, the saw blade 18 may be tilted relative to the semiconductor substrate, or the semiconductor substrate 22 may be tilted relative to the saw blade to the angle of the off angle. In other implementations either or both may be tilted more or less than the off angle to align the longest plane of the saw blade with the off angle 26 of the particular semiconductor substrate.

After the plane of the saw blade 18 is aligned to be perpendicular to the off angle 26 of the semiconductor substrate 22, the method includes cutting through/into the semiconductor substrate with the saw blade at an angle substantially perpendicular with the crystal plane, or parallel to the c-axis, of the hexagonal crystalline lattice of the semiconductor substrate 22. By cutting through the semiconductor substrate 22 at an angle perpendicular to the crystal planes, the forces from the saw blade 18 act directly perpendicularly down on each crystal plane. In turn, the risk of forming cracks, including microcracks, through the substrate 22 may be mitigated as the saw blade 18 is positioned as far from parallel to the crystal plane as possible. Because cracks will propagate through the semiconductor substrate 22 in a direction 20 parallel to the crystal plane more easily than perpendicular to the crystal plane, the fewest cracks are likely to form while cutting the semiconductor substrate 22 as perpendicular with the crystal planes as possible. In addition to cracks, it is more likely for chips and other defects to form the more parallel the plane of the saw blade is oriented with the crystal planes.

In various implementations, the method for cutting, or singulating, a semiconductor substrate 22 may include tilting the saw blade 18 relative to the semiconductor substrate from a first position to a second position and cutting the semiconductor substrate in a first direction which may be parallel to the c-axis. This may be done by tilting either the saw blade 18, tilting the semiconductor substrate, or both the saw blade 18 and the semiconductor substrate. In various implementation, the first position may be the position illustrated in FIG. 1 while the second position may be the position illustrated in FIG. 2. The method may then include tilting the saw blade back to the first position. Once returned to the first position, the method may include either cutting the semiconductor substrate in a second direction perpendicular to the largest planar surface of the semiconductor substrate 22 or tilting the saw blade and/or semiconductor substrate relative to the saw blade and cutting the semiconductor substrate in a second direction at an off-angle.

In addition to reducing cracks and defects in the edges of the die sawn from the semiconductor substrate 22, sawing perpendicularly to the crystal plane may have benefits to the sawing parameters, such as, by non-limiting example, increasing the cutting speed of the saw through the semiconductor substrate 22, reducing the wear rate of the saw blade 18, increasing the lifetime of the saw blade, or other positive improvements in any other parameter involved in the saw process. This may be especially important when sawing SiC semiconductor substrates. Because of the hardness of SiC, a diamond studded saw blade is used to saw through the semiconductor substrate. However, such a blade wears quickly when sawing SiC compared to the wear rate of the same blade sawing through silicon because SiC is close to the hardness of diamond itself. Because of the expense of each diamond studded saw blade, extending the lifetime of the saw blade can provide significant cost benefits to SiC semiconductor substrate processing processes.

Figure 3:
FIG. 3 is a cross sectional side view of an implementation of a singulated semiconductor die.

Referring to FIG. 3, a cross sectional side view of a singulated semiconductor die is illustrated. In various implementations, the semiconductor die 28 may be formed through the process of cutting a semiconductor substrate as described above. In such implementations, one or more sidewalls 30 may be at an angle non-perpendicular with the largest planar surface of the semiconductor die 28, or parallel to the c-axis of the crystalline structure. In various implementations, only 1, 2, 3 or 4 sidewalls may be angled. In particular implementations, only a first sidewall and a second sidewall opposite the first sidewall may be angled relative to the largest planar surface of the semiconductor die 28 while a third sidewall and an opposing fourth sidewall may be perpendicular with the largest planar surface of the semiconductor die 28.

Figure 4:
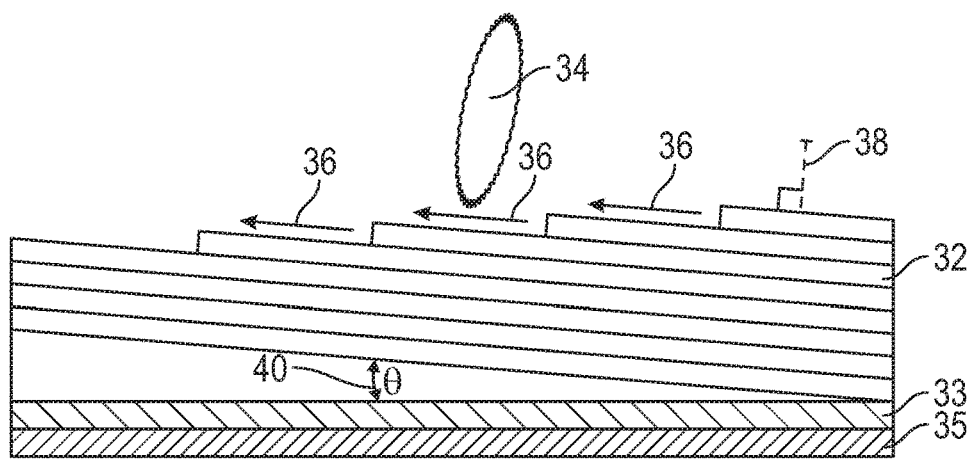
FIG. 4 is a cross sectional side view of a semiconductor substrate with a first saw blade aligned perpendicularly with the crystal plane of the semiconductor substrate.

Referring to FIG. 4, a cross sectional side view of a semiconductor substrate with a first saw blade aligned perpendicularly or substantially perpendicularly with the crystal plane of the semiconductor substrate is illustrated. As illustrated, a semiconductor substrate 32 is coupled to a backmetal layer 33, which are coupled to tape 35. In various implementations, the backmetal layer 33 may be made of, by non-limiting example, copper, nickel, aluminum, metal alloys, multiple metal layers, or other electrically conductive materials. In various implementations, the method for sawing (or otherwise cutting) a semiconductor substrate 32 includes aligning a first saw blade 34 substantially perpendicularly with a crystal plane (which may follow the direction 36 of lateral step flow growth of the crystalline lattice) of a crystalline lattice, which may be hexagonal. In other words, the method for cutting the semiconductor substrate 32 includes aligning the first saw blade 34 parallel with or substantially parallel with the c-axis 38, or perpendicular with or substantially perpendicular with the off angle 40.

In various implementations, the first saw blade 34 may be a diamond studded saw blade, where the diamond particles are held in a binding matrix that forms the structure of the saw blade. In various implementations, the semiconductor substrate 32 may be tilted to align the c-axis 38 parallel with a plane aligned with the longest dimension of the first saw blade 34 aligned at the center of the kerf of the first saw blade. In other implementations, the first saw blade 34 itself may be tilted to align with the crystal plane perpendicularly, or the c-axis 38 parallel, to the plane of the first saw blade. In various implementations, the first saw blade 34 may be tilted relative to the semiconductor substrate, or the semiconductor substrate 32 may be tilted relative to the first saw blade to the angle of the off angle. In other implementations either or both may be tilted more or less than the off angle to align the longest plane of the first saw blade with the off angle 40 of the particular semiconductor substrate.

Figure 5:
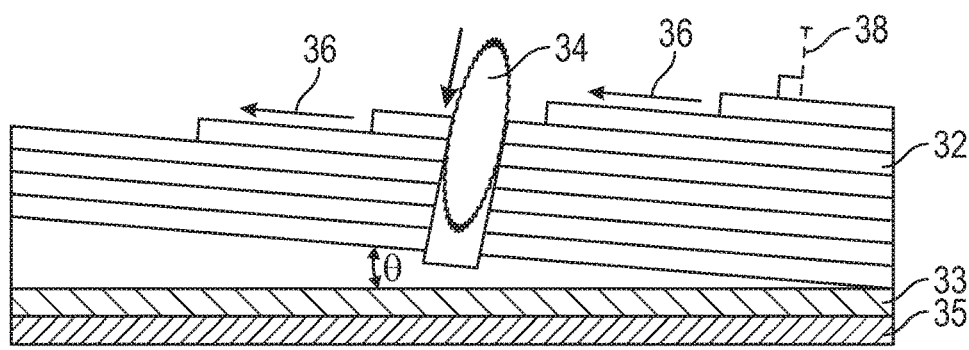
FIG. 5 is a cross sectional side view of a first saw blade cutting through at least a majority of the semiconductor substrate at an angle perpendicular with the crystal plane.

Referring to FIG. 5, a cross sectional side view of a first saw blade cutting through at least a majority of the semiconductor substrate at an angle perpendicular or substantially perpendicular with the crystal plane is illustrated. After the plane of the first saw blade 34 is aligned to be perpendicular to the off angle 40 of the semiconductor substrate 32, the method includes cutting through/into at least a majority of the semiconductor substrate with the first saw blade at an angle substantially perpendicular with the crystal plane, or parallel to the c-axis, of the hexagonal crystalline lattice of the semiconductor substrate 32. In various implementations, cutting through at least a majority of the semiconductor substrate may include cutting 80% of the way through, 85% of the way through, 90% of the way through, 95%, or 99% of the way through the semiconductor substrate, by non-limiting example. As illustrated, a cut 37 of the first saw blade 34 does not reach all the way through the semiconductor substrate 32, or through to the backmetal layer 33 or the tape 35. By cutting at least a majority of the way through the semiconductor substrate 32 at an angle perpendicular to the crystal planes, the forces from the first saw blade 34 act directly perpendicularly down on each crystal plane. In turn, the risk of forming cracks, including microcracks, through the substrate 32 may be mitigated as the first saw blade 34 is positioned as far from parallel to the crystal plane as possible. Because cracks will propagate through the semiconductor substrate 32 in a direction 36 parallel to the crystal plane more easily than perpendicular to the crystal plane, the fewest cracks are likely to form while cutting the semiconductor substrate 32 as perpendicular with the crystal planes as possible. In addition to cracks, it is more likely for chips and other defects to form the more parallel the plane of the first saw blade is oriented with the crystal planes.

Figure 6:
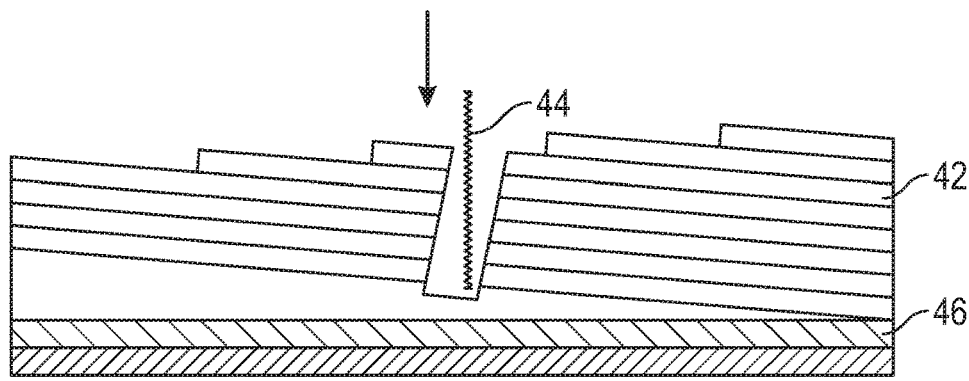
FIG. 6 is a cross sectional side view of a semiconductor substrate with a second saw blade aligned perpendicularly with the semiconductor substrate.

Referring to FIG. 6, a cross sectional side view of a semiconductor substrate with a second saw blade aligned perpendicularly or substantially perpendicularly with the semiconductor substrate is illustrated. In various implementations, after a semiconductor substrate 42 has been cut with the first saw blade, as described above, a second saw blade 44 is aligned substantially perpendicularly with a planar surface of the semiconductor substrate 42. In other words, the second saw blade 44 is aligned parallel with a 90 degree angle relative to the largest planar surface of the semiconductor substrate 42. In such implementations, the angle of the second saw blade 44 thus differs from the angle of the first saw blade. In other various implementations, the saw blade may be aligned with a planar surface of a backmetal layer 46 coupled to the semiconductor substrate 42.

Figure 7:
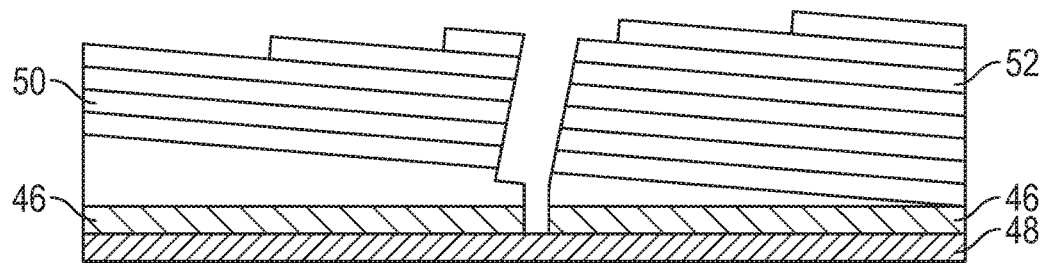
FIG. 7 is a cross sectional side view of singulated semiconductor die after cutting entirely through the semiconductor substrate and the backmetal layer using the second saw blade.

Referring to FIG. 7, a cross sectional side view of singulated semiconductor die after cutting entirely through the semiconductor substrate and the backmetal layer using the second saw blade is illustrated. As can be seen, the resulting shape of the cut includes an angled portion and a perpendicular portion to the planar surface of the backmetal layer 46. After the second saw blade is aligned, as described above, a first semiconductor die 50 and a second semiconductor die are singulated/formed, using the second saw blade, to cut entirely through, or the rest of the way through, the semiconductor substrate. In various implementations, the second saw blade also cuts down through the backmetal layer 46. In other various implementations, the second saw blade does not cut through the tape 48. However, in other implementations, the second saw blade may cut down into a portion of the tape as well. In various implementations, surfactants or a carbon dioxide bubbling process may be used in any of the above steps to prevent corrosion of the substrate/wafer materials/backmetal during the sawing process.

In places where the description above refers to particular implementations of semiconductor substrate singulation systems and implementing components, sub-components, methods and sub-methods, it should be readily apparent that a number of modifications may be made without departing from the spirit thereof and that these implementations, implementing components, sub-components, methods and sub-methods may be applied to other semiconductor substrate singulation systems.

What is claimed is:

1. A method for cutting a semiconductor substrate comprising:
   aligning a first saw blade substantially perpendicularly with a crystal plane of a non-cubic crystalline lattice of a semiconductor substrate coupled with a backmetal layer;
   cutting through at least a majority of the semiconductor substrate at an angle substantially perpendicular with the crystal plane of the non-cubic crystalline lattice of the semiconductor substrate
   aligning a second saw blade substantially perpendicularly with the semiconductor substrate; and
   cutting entirely through the semiconductor substrate and the backmetal layer using the second saw blade.

2. The method of claim 1, wherein the non-cubic crystalline lattice is hexagonal.

3. The method of claim 1, wherein the crystal plane is angled at four degrees from a largest planar surface of the semiconductor substrate.

4. The method of claim 1, wherein the first saw blade is aligned by tilting relative to the semiconductor substrate.

5. The method of claim 1, wherein the first saw blade is aligned by tilting the semiconductor substrate relative to the first saw blade.

6. The method of claim 1, wherein cutting through at least the majority of the semiconductor substrate further comprises cutting through 95% of the semiconductor substrate.

7. The method of claim 1, wherein cutting through at least the majority of the semiconductor substrate further comprises cutting through 99% of the semiconductor substrate.

8. A method for cutting a silicon carbide semiconductor substrate comprising:
   aligning a first saw blade substantially perpendicularly with an off angle of the crystal lattice of a silicon carbide semiconductor substrate coupled with a backmetal layer;
   cutting through at least a majority of the silicon carbide semiconductor substrate with the first saw blade at a substantially perpendicular angle;
   aligning a second saw blade substantially perpendicularly with the silicon carbide semiconductor substrate; and
   cutting entirely through the silicon carbide semiconductor substrate and the backmetal layer using the second saw blade.

9. The method of claim 8, wherein cutting through at least the majority of the silicon carbide semiconductor substrate further comprises cutting through 95% of the silicon carbide semiconductor substrate.

10. The method of claim 8, wherein the crystal lattice is angled at four degrees relative to a largest planar surface of the silicon carbide semiconductor substrate.

11. The method of claim 8, wherein the first saw blade is aligned by tilting relative to the silicon carbide semiconductor substrate.

12. The method of claim 8, wherein the first saw blade is aligned by tilting the silicon carbide semiconductor substrate relative to the first saw blade.

13. A method for singulating a silicon carbide semiconductor substrate comprising:
aligning a first saw blade substantially parallel with a c-axis of a silicon carbide semiconductor substrate coupled with a backmetal layer;
cutting through at least a majority of the silicon carbide semiconductor substrate at an angle substantially parallel with the c-axis of the silicon carbide semiconductor substrate;
aligning a second saw blade substantially perpendicularly with the silicon carbide semiconductor substrate; and
singulating the silicon carbide semiconductor substrate into a plurality of semiconductor die by cutting entirely through the silicon carbide semiconductor substrate and the backmetal layer using the second saw blade.

14. The method of claim 13, further comprising tilting the first saw blade relative to the silicon carbide semiconductor substrate from a first position to a second position and cutting the silicon carbide semiconductor substrate in a first direction.

15. The method of claim 14, further comprising tilting the first saw blade back to the first position.

16. The method of claim 14, further comprising tilting the silicon carbide semiconductor substrate relative to the first saw blade and cutting the silicon carbide substrate in a second position.

17. The method of claim 13, wherein the first saw blade and the second saw blade comprise diamond.

18. The method of claim 13, wherein the c-axis is angled at four degrees relative to a largest planar surface of the silicon carbide semiconductor substrate.

19. The method of claim 13, wherein a first sidewall and a second sidewall of each semiconductor die of the plurality of semiconductor die are each angled relative to a largest planar surface of each semiconductor die.

20. The method of claim 19, wherein a third sidewall and a fourth sidewall of each semiconductor die of the plurality of semiconductor die are each substantially perpendicular to the largest planar surface of each semiconductor die.

* * * * *